United States Patent [19]
Yamazaki

[11] Patent Number: 5,091,768
[45] Date of Patent: Feb. 25, 1992

[54] SEMICONDUCTOR DEVICE HAVING A FUNNEL SHAPED INTER-LEVEL CONNECTION

[75] Inventor: Yasushi Yamazaki, Tokyo, Japan

[73] Assignee: NEC Corporation, Japan

[21] Appl. No.: 467,122

[22] Filed: Jan. 18, 1990

[30] Foreign Application Priority Data

Jan. 25, 1989 [JP] Japan ................... 1-16723

[51] Int. Cl.⁵ .................... H01L 21/94; H01L 21/95
[52] U.S. Cl. ............................ 357/71; 357/54
[58] Field of Search ................. 357/71, 54, 68

[56] References Cited

U.S. PATENT DOCUMENTS

| | | | |
|---|---|---|---|
| 4,502,210 | 3/1985 | Okumura et al. | 357/71 |
| 4,613,888 | 9/1986 | Mase et al. | 357/54 |
| 4,618,878 | 10/1986 | Aoyama et al. | 357/54 |
| 4,692,786 | 9/1987 | Lindenfelser | 357/54 |
| 4,710,241 | 12/1987 | Komatsu | 357/71 |
| 4,731,346 | 3/1988 | Ashwall | 357/54 |
| 4,748,492 | 5/1988 | Iwase et al. | 357/54 |

Primary Examiner—Rolf Hille
Assistant Examiner—S. V. Clark
Attorney, Agent, or Firm—Laff, Whitesel, Conte & Saret

[57] ABSTRACT

A semiconductor device has a funnel shaped contact window for providing an inter-level connection between a lower silicon or polysilicon film and an upper metal wiring strip, and the funnel shaped contact window is formed in an inter-level insulating film structure consisting of a lower insulating film of phosphosilicate glass and an upper insulating film of silicon dioxide, since an isotropical etching is firstly applied to the silicon dioxide film and followed by an anisotropical etching to the phosphosilicate glass film by using the same mask layer, the lower portion of the contact window is smaller in cross sectional area than the upper portion, and the funnel shaped contact window thus formed is effective to create a smooth topography of an upper metal wiring strip for preventing from undesirable disconnection.

7 Claims, 5 Drawing Sheets

SEMICONDUCTOR DEVICE HAVING A FUNNEL SHAPED INTER-LEVEL CONNECTION

FIELD OF THE INVENTION

This invention relates to a semiconductor device and, more particularly, to the structure of an interconnection between a lower conductive layer and an upper conductive layer.

DESCRIPTION OF THE RELATED ART

A semiconductor device is fabricated into a multiple level structure, and inter-level connections provide the electrical paths between the different levels. In a semiconductor device an upper level wiring strip per se provides the inter-level connection, and such an inter-level connection is produced through the following steps. Namely, when a lower level conductive film is formed, an inter-level insulating film is deposited over the entire surface, and a contact window is, then, formed in the inter-level conductive layer for partially exposing the lower level conductive layer. An conductive metal such as aluminum is deposited over the entire surface, so that the aluminum film penetrates into the contact window, then being patterned so as to form the upper level wiring strip. In this example, a smooth topography hardly takes place, and, accordingly, a poor coverage is causative of undesirable disconnection.

Another structure has been proposed for provision of a solution inherent in such a prior art inter-level connection. Referring to FIG. 1 of the drawings, an n-type impurity region 1 is formed in a p-type silicon substrate 2, and phosphosilicate glass is deposited to a thickness of about 5000 angstroms over the entire surface of the structure by using a chemical vapor deposition technique. The phosphosilicate glass film 3 is anisotropically etched away by using a reactive etching technique to from a contact window 4, and a polysilicon is deposited to a thickness of about 1 micron by using an usual chemical vapor deposition technique. Since the contact window 4 is formed in the phosphosilicate glass film 3, the polysilicon fills the contact window and further spreads over the phosphosilicate glass film 3, thereby providing a generally flat top surface. The polysilicon thus deposited is uniformly removed through an etch-back technique until the to p surface of the phosphosilicate glass film 3 is exposed, so that a piece of polysilicon 5 is left in the contact window 4. When the contact window 4 is filled with the piece of polysilicon 5, an aluminum is deposited over the entire surface by using a sputtering technique, and the aluminum film is patterned to form an upper wiring strip 6.

However, a problem is encountered in the prior art structure in that undesirable cracks still take place along the periphery of the contact window 4. This is because of the fact that the piece of polysilicon 5 does not completely fill the contact window 4, and this step configuration is causative of the recess formed above the contact window 4. When the recess 7 takes place, cracks are much liable to be produced. The reason why the step configuration takes place is that the polysilicon film of 1 micron hardly creates a strictly flat top surface, and the inequality sometimes causes the piece of polysilicon 5 not to be coplanar with the phosphosilicate glass film 3.

SUMMARY OF THE INVENTION

It is therefore an important object of the present invention to provide a semiconductor device which has inter-level connections each free from disconnection.

To accomplish these objects, the present invention proposes to form a funnel shaped inter-level connection.

In accordance with the present invention, there is provided a semiconductor device having at least one transistor, comprising a) a lower conductive layer; b) an inter-level insulating film structure provided on the lower conductive layer, a contact window being formed in the inter-level insulating film structure; c) an inter-level connection provided in the contact window and contacting at the bottom surface thereof with the lower conductive layer; and d) an upper conductive layer formed on the inter-level insulating film structure and electrically connected to the inter-level connection, in which the inter-level insulating film structure comprises a lower insulating film having a lower part of the contact window and an upper insulating film having an upper part of the contact window, and in which the lower part of the contact window is smaller in cross sectional area than the upper part of the contact window.

BRIEF DESCRIPTION OF THE DRAWINGS

The features and advantages of a semiconductor device according to the present invention will be more clearly understood from the following description taken in conjunction with the accompanying drawings in which.

DESCRIPTION OF THE PREFERRED EMBODIMENTS

First Embodiment

Figure 1:
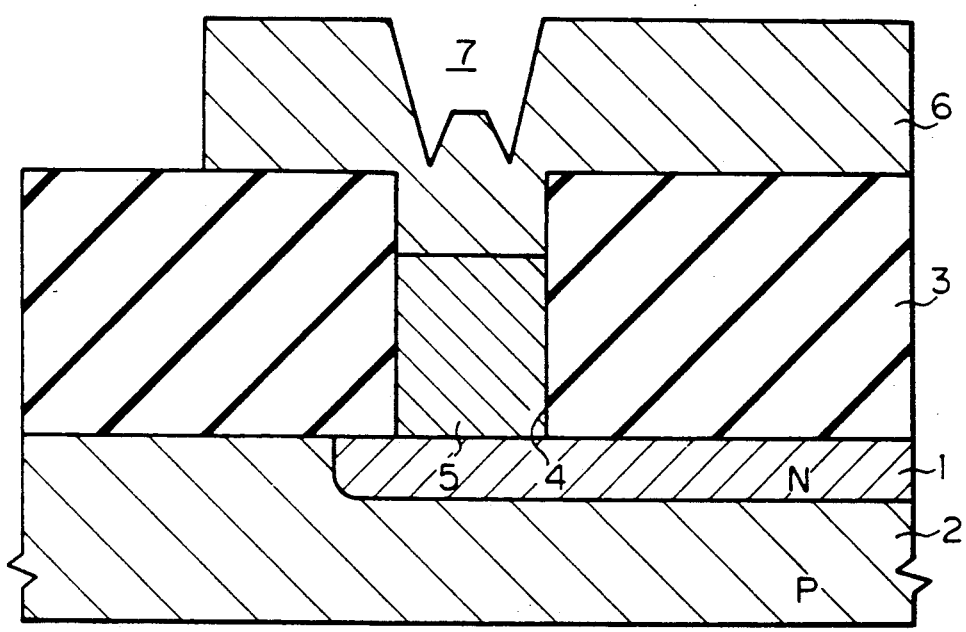
FIG. 1 is a cross sectional view showing the structure of a prior art semiconductor device.
Figure 2:
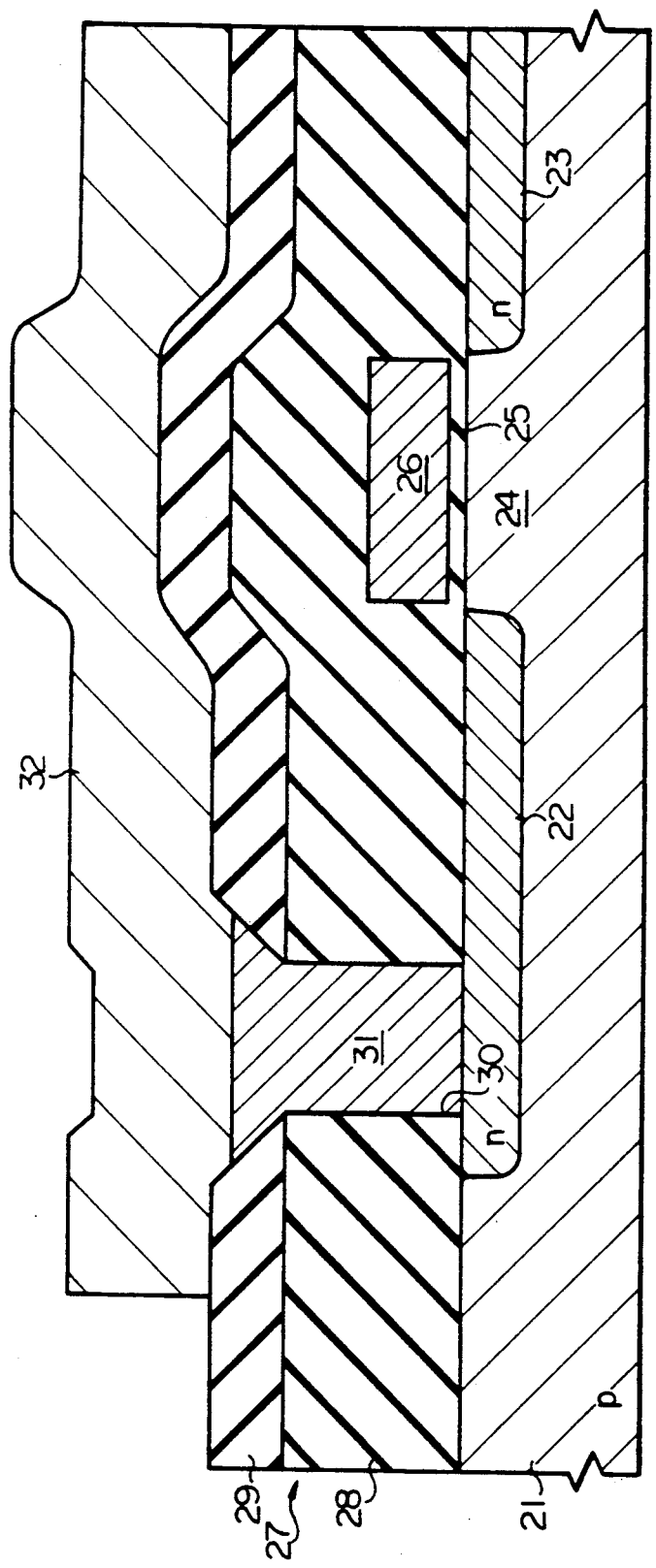
FIG. 2 is a cross sectional view showing the structure of a semiconductor device embodying the present invention.

Referring to FIG. 2 of the drawings, a semiconductor device according to the present invention is fabricated on a p-type single crystal silicon substrate 21. In the silicon substrate 21 are formed n-type source and drain regions 22 and 23 which are spaced apart from each other by a channel forming area 24. A thin gate oxide film 25 is grown over the channel forming area 24, and a gate electrode 26 is provided on the gate oxide film 25. The source and drain regions 22 and 23, the gate oxide film 25 and the gate electrode 26 as a whole constitute a field effect transistor. A large number of field effect transistors are formed on the silicon substrate 21, however, only one the field effect transistor is shown in FIG. 2 for the sake of simple illustration.

The silicon substrate 21 as well as the gate electrode 26 are covered with an inter-level insulating film structure 27 consisting of a lower insulating film 28 of a phosphosilicate glass film 28 and an upper insulating film 29 of a silicon oxide, and a contact window 30 is formed in the inter-level insulating film structure 27.

The contact window has lower and upper portions passing through the lower insulating film 28 and the upper insulating film 29, respectively, and the lower portion is smaller in the cross sectional area than the upper portion. The contact window thus shaped is of the generally funnel configuration. The funnel shaped contact window 30 is partially filled with a piece of an n-type impurity doped polysilicon 31 the top surface of which is slightly lower than the top surface of the upper insulating film 29. On the inter-level insulating film structure 27 extends an upper wiring strip 32 of an aluminum which is in contact with the piece of the polysilicon 31. The upper wiring strip 32 serves as, for example, a power supply line, and the electric power is supplied through the upper wiring strip 32 and the piece of polysilicon 31 to the source region 22 of the field effect transistor.

Description is hereinbelow made on a process sequence for fabricating the semiconductor device with reference to FIGS. 3A to 3F.

Figure 3A:
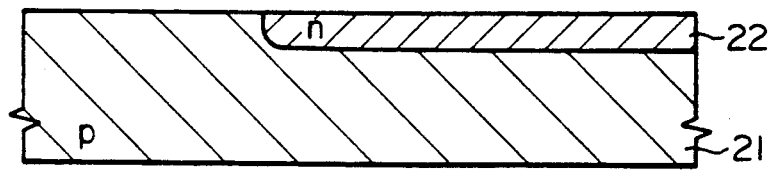
FIGS. 3A to 3F are cross sectional views showing the process sequence through which the semiconductor device shown in FIG. 2 is fabricated.

First, the single crystal silicon substrate 21 is prepared, and the thin gate oxide film 25 is thermally grown on the silicon substrate 21. Subsequently, n-type impurity atoms are doped into the silicon substrate 21 so as to form the source and drain regions 22 and 23 in a self-align fashion with respect to the gate electrode 26. An essential part of the resultant structure is shown in FIG. 3A.

Figure 3B:
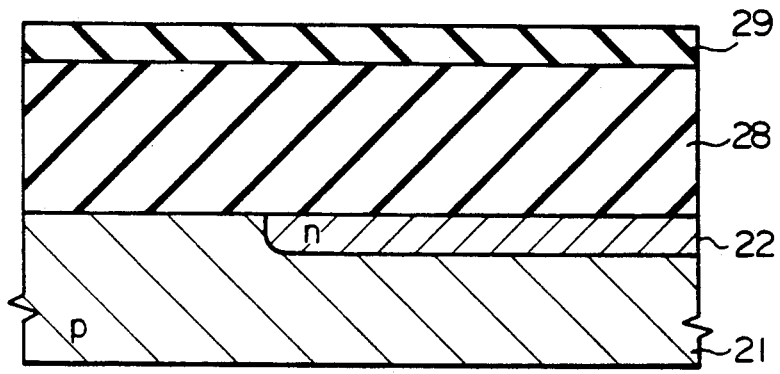

The phosphosilicate glass is firstly deposited to a thickness of about 5000 angstroms on the entire surface of the structure by using a chemical vapor deposition technique, and silicon dioxide is, then, deposited to a thickness of about 1000 angstroms on the phosphosilicate glass film 28 by using a usual chemical vapor deposition technique. The phosphosilicate glass is smaller in etching rate than the silicon dioxide. In fact, the phosphosilicate glass is of the order of 450 angstroms per minute, but the silicon dioxide is as large as 800 angstroms per minute. The resultant structure of this stage is shown in FIG. 3B.

Figure 3C:
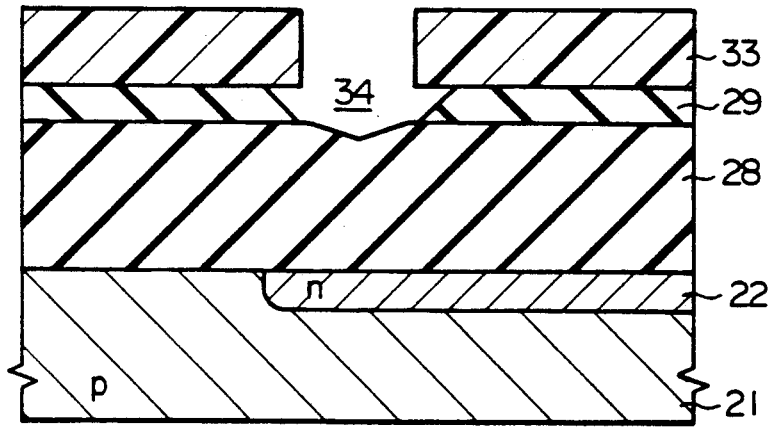
Figure 3D:
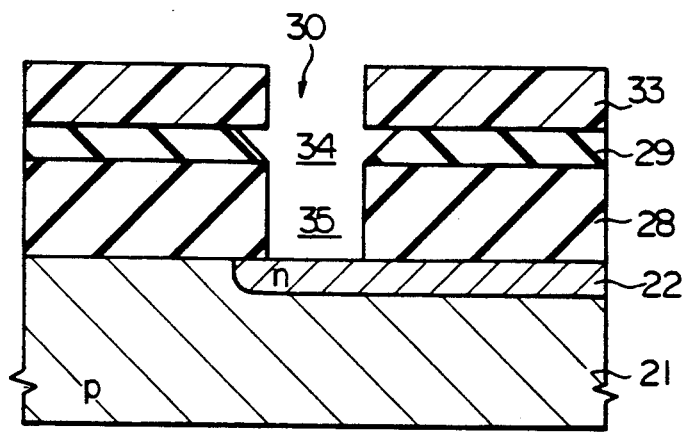

A photoresist solution is spun onto the silicon dioxide film 29, and is, then, patterned through usual lithographic techniques so that a mask layer 33 is provided on the silicon dioxide film 29. The mask layer 33 exposes a part of the silicon dioxide film 29 where the upper portion of the funnel shaped contact window 30 will be shaped in the later stage. The exposed area of the silicon dioxide film 29 is isotropically etched by using a wet etching technique as shown in FIG. 3C, and the recess 34 formed in the silicon dioxide film 29 is about 2 micron in diameter. Since the recess 34 is formed in an isotropical manner, the upper periphery of the recess 34 extends beneath the bottom surface of the mask layer 33. After the formation of the recess 34, the phosphosilicate glass film 28 is anisotropically etched by using the mask layer 33, and a hollow space 35 is formed in the phosphosilicate glass film 28. The hollow space 35 is square in cross section, and the square is measured as 1 micron × 1 micron. The recess 34 and the hollow space 35 form in combination the funnel shaped contact window 30 as shown in FIG. 3D.

Figure 3E:
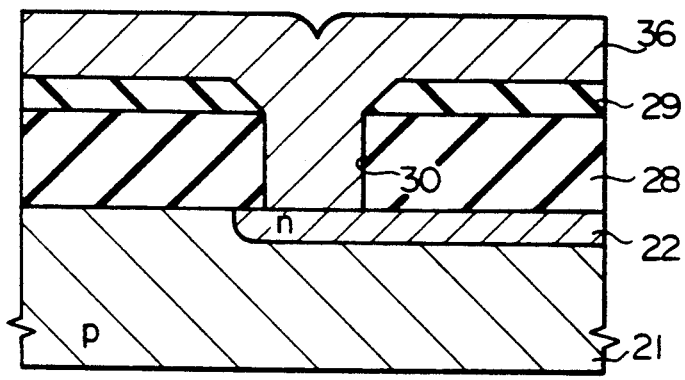

A polysilicon 36 is then deposited to a thickness of about 1 micron over the entire surface of the structure, and the polysilicon 36 penetrates into the funnel shaped contact window 30. The resultant structure of this stage is shown in FIG. 3E.

Figure 3F:
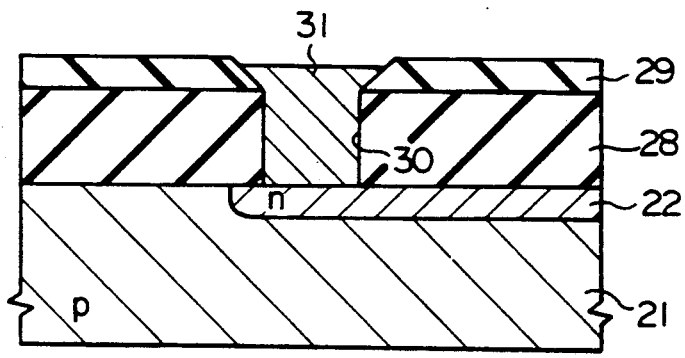

An etch-back technique is, then, applied to the polysilicon film 36. Namely, the polysilicon film 36 is isotropically etched away by using a dry etching technique until the top surface of the silicon dioxide film 29 is exposed. The top surface of the piece of the polysilicon 31 may be slightly lowered with respect to the top surface of the silicon dioxide film 29 because of the unequal top surface of the doped polysilicon 36. However, the top surface of the piece of the polysilicon 31 is much closer to the top surface of the silicon dioxide film 29 by virtue of the funnel shaped contact window 30. N-type impurity atoms are ion implanted into the piece of the polysilicon 31 for providing an ohmic contact. The resultant structure of this stage is shown in FIG. 3F.

An aluminum is sputtered on the entire surface of the structure, and the aluminum film is patterned to form the upper wiring strip 32. On the entire surface of the structure is further deposited a passivation film, however, the passivation film is omitted from the structure shown in FIG. 2. Since the piece of the doped polysilicon 31 substantially fills the funnel shaped contact window 30, a smooth topology is created, and, accordingly, no cracks takes place in the upper wiring strip 32.

Second Embodiment

Figure 4:
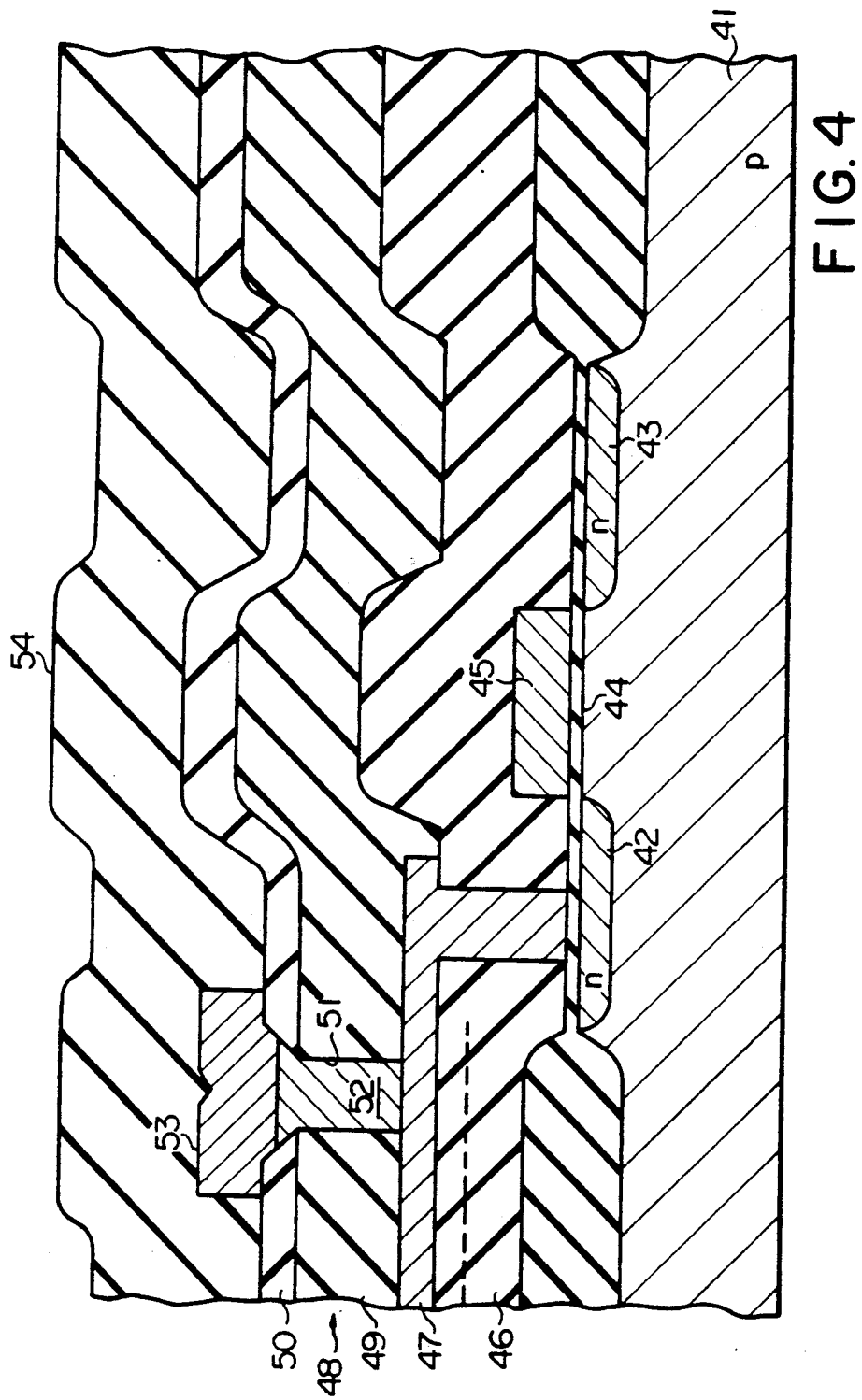
FIG. 4 is a cross sectional view showing the structure of another semiconductor device embodying the present invention.

Turning to FIG. 4 of the drawings, another semiconductor device is fabricated on a p-type single crystal silicon substrate 41, and the semiconductor device has a field effect transistor which is formed with n-type source and drain regions 42 and 43, a gate oxide film 44 and a gate electrode 45. An insulating film 46 covers the semiconductor substrate 41 and the field effect transistor, and a lower conductive film 47 of a polysilicon is brought into contact with the source region 42 through a contact window formed in the insulating film 46.

On the lower conductive film 47 is provided an inter-level insulating film structure 48 which consists of a lower insulating film 49 of a phosphosilicate glass and an upper insulating film 50 of silicon dioxide. A funnel shaped contact window 51 is formed in the inter-level insulating film structure 48, and is filled with an n-type impurity doped polysilicon 52. On the inter-level insulating film structure 48 is patterned an upper wiring strip 53 of an aluminum which is in contact with the piece of the doped polysilicon 52 for electrical conduction. A passivation film 54 is deposited over the entire surface of the structure for providing protection.

In this instance, the funnel shaped contact window 51 is also effective for preventing the upper wiring strip 53 from undesirable cracks. The process sequence is similar to that illustrated in FIGS. 3A to 3F, and, for this reason no description is incorporated.

As will be understood from the foregoing description, the funnel shaped contact window according to the present invention is advantageous over the prior art column shaped contact window in the improved coverage and in the smooth topography.

Although particular embodiments of the present invention have been shown and described, it will be obvious to those skilled in the art that various changes and modifications may be made without departing from the spirit and scope of the present invention.

I claim:

1. A semiconductor device having at least one transistor, said device comprising:

a) a lower conductive layer,
   b) an inter-level insulating film structure provided on said lower conductive layer, a contact window being formed in said inter-level insulating film structure, c) an inter-level connection provided in said contact window and making contact at the bottom surface thereof with said lower conductive layer, and d) an upper conductive layer formed on said inter-level insulating film structure and electrically connected to said inter-level connection, in which said inter-level insulating film structure comprises a lower insulating film having a lower part of said contact window and an upper insulating film having an upper part of said contact window defined by tapered walls thereof, and in which the upper part of the contact window is increased in cross sectional area from said lower part of said upper contact window part to said upper part of said upper contact window part, said inter-level connection being accommodated in the lower and upper parts of said contact window without extending from said upper part, said inter-level connection having a generally flat upper surface substantially in parallel to an upper surface of said inter-level insulating film structure.

2. A semiconductor device as set forth in claim 1, in which said lower conductive layer is formed by an impurity region formed in a semiconductor substrate where said semiconductor device is fabricated.

3. A semiconductor device as set forth in claim 1, in which said inter-level connection is shaped into a generally funnel configuration.

4. A semiconductor device as set forth in claim 3, in which said inter-level connection is formed of a polysilicon.

5. A semiconductor device as set forth in claim 4, in which said lower insulating film and said upper insulating film are formed of a phosphosilicate glass and a silicon oxide, respectively.

6. A semiconductor device as set forth in claim 1, in which said lower conductive layer is formed by a lower conductive film provided on an insulating layer which in turn is provided over a semiconductor substrate.

7. A semiconductor device as set forth in claim 6, in which said inter-level connection is shaped into a generally funnel configuration.

* * * * *